United States Patent
Kim et al.

(10) Patent No.: US 11,581,055 B2
(45) Date of Patent: Feb. 14, 2023

(54) MEMORY SYSTEM

(71) Applicant: SK hynix Inc., Gyeonggi-do (KR)

(72) Inventors: Hyun Sub Kim, Gyeonggi-do (KR); Ie Ryung Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/393,288

(22) Filed: Aug. 3, 2021

(65) Prior Publication Data

US 2022/0246230 A1 Aug. 4, 2022

(30) Foreign Application Priority Data

Feb. 2, 2021 (KR) .................. 10-2021-0014795

(51) Int. Cl.
*G11C 29/12* (2006.01)
*G11C 29/42* (2006.01)
*G11C 29/36* (2006.01)

(52) U.S. Cl.
CPC .......... *G11C 29/42* (2013.01); *G11C 29/1201* (2013.01); *G11C 29/12005* (2013.01); *G11C 29/12015* (2013.01); *G11C 29/36* (2013.01); *G11C 2029/3602* (2013.01)

(58) Field of Classification Search
CPC .............. G11C 29/42; G11C 29/12005; G11C 29/1201; G11C 29/12015; G11C 29/36; G11C 2029/3602
See application file for complete search history.

(56) References Cited

U.S. PATENT DOCUMENTS

| 6,269,051 | B1 * | 7/2001 | Funaba .................. G11C 7/222 365/194 |
| 7,085,982 | B2 | 8/2006 | Shinbo et al. |
| 2003/0140286 | A1 * | 7/2003 | Shinbo .................. H03K 5/135 714/699 |
| 2005/0021920 | A1 | 1/2005 | Cornelius et al. |
| 2005/0063238 | A1 * | 3/2005 | Nambu ............... G11C 11/4096 365/222 |
| 2012/0176263 | A1 | 7/2012 | Imai et al. |

FOREIGN PATENT DOCUMENTS

KR 10-2009-0035508 A 4/2009

* cited by examiner

*Primary Examiner* — Mohammed A Bashar

(74) *Attorney, Agent, or Firm* — IP & T Group LLP

(57) ABSTRACT

A memory system includes a memory device and a controller. The controller is coupled to the memory device through input/output (I/O) lines. The controller includes an interface component and a dummy power consumption component. The interface component performs a signal training operation for adjusting a timing of a clock signal, to which test data is synchronized. The dummy power consumption component performs a dummy power consumption operation while the signal training operation is performed.

18 Claims, 9 Drawing Sheets

MEMORY SYSTEM

CROSS-REFERENCES TO RELATED APPLICATION

The present application claims priority under 35 U.S.C. § 119(a) to Korean patent application number 10-2021-0014795, filed on Feb. 2, 2021, which is incorporated herein by reference in its entirety.

BACKGROUND

1. Technical Field

Various embodiments of the present disclosure are related to a memory system, and more particularly, to a memory system including a nonvolatile memory device.

2. Related Art

A memory system may be configured to store data provided by a host device in response to a write request from the host device. Furthermore, the memory system may be configured to provide stored data to the host device in response to a read request from the host device. The host device is an electronic device capable of processing data and may include a computer, a digital camera, a mobile phone and so forth. To operate, the memory system may be mounted in the host device or may be fabricated to be capable of being connected to and detached from the host device.

SUMMARY

In an embodiment of the present disclosure, a memory system may include a memory device and a controller. The controller may be coupled to the memory device through input/output (I/O) lines. The controller may include an interface component and a dummy power consumption component. The interface component may be configured to perform a signal training operation for adjusting a timing of a clock signal, to which test data is synchronized. The dummy power consumption component may be configured to perform a dummy power consumption operation while the signal training operation is performed.

In an embodiment of the present disclosure, a memory system may include a memory device and a controller. The memory device may be coupled to one or more input/output (I/O) lines and one or more dummy I/O lines. The controller may be configured to transfer dummy data through the dummy I/O lines while test data is transferred through the I/O lines during a signal training operation.

In an embodiment of the present disclosure, a memory system may include a memory device and a controller. The controller may be coupled to the memory device through input/output (I/O) lines and may include an error correction code (ECC) component. The ECC component may be configured to perform an error-correcting operation on data transferred from the memory device through the I/O lines. The ECC component may be configured to perform a dummy ECC operation when restricted test data is transferred through the I/O lines during a signal training operation.

In an embodiment of the present disclosure, a system may include a memory device, a plurality of normal input/output (I/O) lines, one or more dummy I/O lines, and a controller. The plurality of normal input/output (I/O) lines may include a particular normal I/O line and remaining normal I/O lines. The controller may be coupled to the memory device through the plurality of normal I/O lines and the dummy I/O lines and configured to simultaneously transfer, to the memory device, test data through the plurality of normal I/O lines and dummy data through the dummy I/O lines. The dummy data may be fully toggling data and the test data toggles less than the full toggling data. The bit of the test data on the particular normal I/O line at a first time point may have a different value from a bit of the test data on the particular normal I/O line at a second time point, and bits of the test data on the remaining normal I/O lines at the first time point may be the same as bits of the test data on the remaining normal I/O lines at the second time point.

DETAILED DESCRIPTION

Various embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

The drawings are not necessarily to scale and, in some instances, proportions may have been exaggerated in order to clearly illustrate features of the embodiments. The terminology used herein is for the purpose of describing particular embodiments only and is not intended to be limiting of the disclosure.

As used herein, the term "and/or" includes at least one of the associated listed items. It will be understood that when an element is referred to as being "connected to", or "coupled to" another element, it may be directly on, connected to, or coupled to the other element, or one or more intervening elements may be present. As used herein, singular forms are intended to include the plural forms and vice versa, unless the context clearly indicates otherwise. It will be further understood that the terms "comprises," "comprising," "includes," and "including" when used in this specification, specify the presence of the stated elements and do not preclude the presence or addition of one or more other elements.

Hereinafter, various embodiments of the present disclosure will be described below with reference to the accompanying drawings.

According to an embodiment of the present disclosure, provided may be a memory system capable of performing a signal training operation with improved accuracy.

Figure 1:
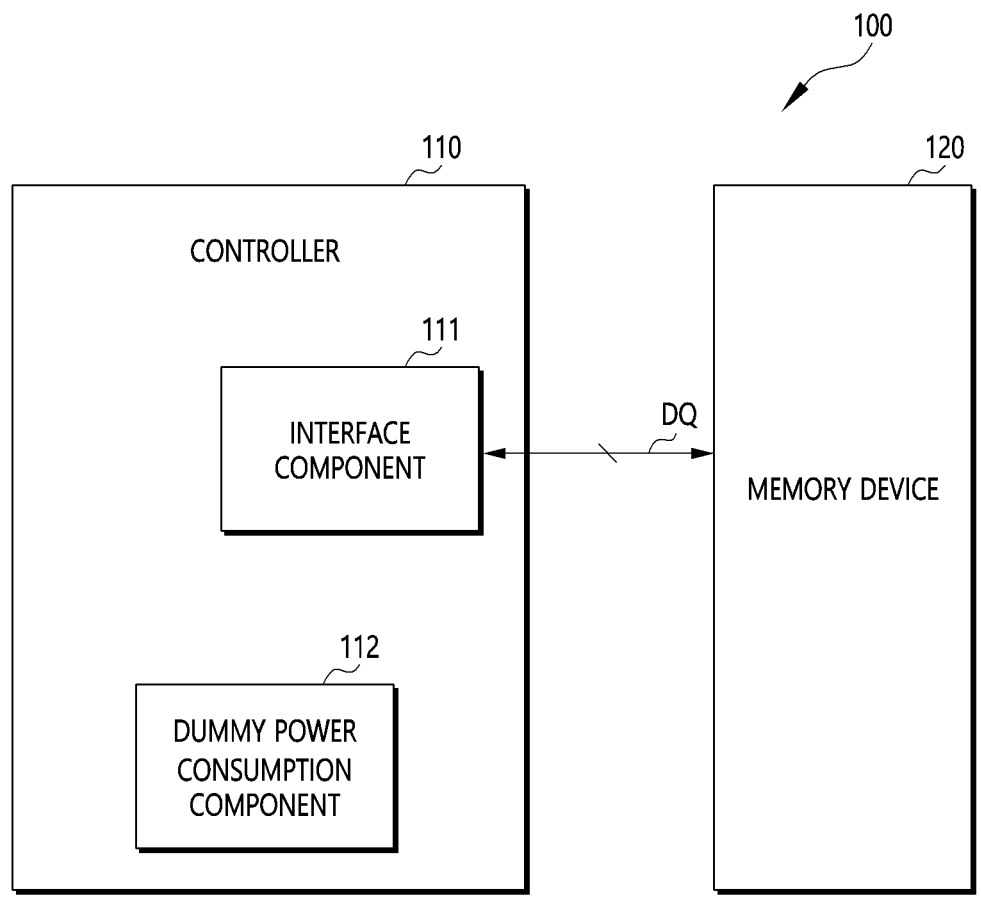
FIG. 1 is a block diagram illustrating a memory system according to an embodiment of the present disclosure.

FIG. 1 is a block diagram illustrating a memory system 100 according to an embodiment of the present disclosure.

The memory system 100 may be configured to store data provided by an external host device in response to a write request from the host device. Furthermore, the memory system 100 may be configured to provide stored data therein to the host device in response to a read request from the host device.

The memory system 100 may be configured as a personal computer memory card international association (PCMCIA) card, a compact flash (CF) card, a smart media card, a memory stick, various multimedia cards (e.g., MMC, eMMC, RS-MMC, and MMC-micro), secure digital (SD) cards (e.g., SD, Mini-SD and Micro-SD), a universal flash storage (UFS) or a solid state drive (SSD).

The memory system 100 may include a controller 110 and a memory device 120.

The controller 110 may control an overall operation of the memory system 100. The controller 110 may control the memory device 120 in order to perform a foreground operation in response to an instruction from the host device. The foreground operation may include operations of writing data into the memory device 120 and reading data from the memory device 120 in response to instructions from the host device, that is, a write request and a read request.

Furthermore, the controller 110 may control the memory device 120 to perform an internally necessary background operation independently of the host device. The background operation may include at least one of a wear-leveling operation, a garbage collection operation, an erase operation, a read reclaim operation and a refresh operation for the memory device 120. Like the foreground operation, the background operation may include operations of writing data into the memory device 120 and reading data from the memory device 120.

The controller 110 may include an interface component 111 and a dummy power consumption component 112. The interface component 111 and the dummy power consumption component 112 include all circuits, systems, software, firmware and devices necessary for their respective operations and functions.

The interface component 111 may be coupled to the memory device 120 through input/output (I/O) lines DQ. The interface component 111 may provide the memory device 120 with data through the I/O lines DQ and may receive data from the memory device 120 through the I/O lines DQ.

The interface component 111 may perform a signal training operation on the memory device 120. The signal training operation may be performed between the interface component 111 and the memory device 120 in order to improve accuracy, with which data transferred through the I/O lines DQ is sampled. Specifically, the interface component 111 may provide test data to the memory device 120 through the I/O lines DQ while adjusting timings of a clock signal, to which the test data is synchronized, to perform a signal training operation. Also, the interface component 111 may receive test data from the memory device 120 through the I/O lines DQ while adjusting timings of a clock signal, to which the test data is synchronized, to perform a signal training operation. The interface component 111 may adjust the timings of the clock signal so that the test data transferred to the memory device 120 or the interface component 111 is correctly sampled through the timing-adjusted clock signal. For example, the interface component 111 may adjust the timings of the clock signal so that an edge of the timing-adjusted clock signal is positioned at a center of the test data. The interface component 111 may include a delay locked loop circuit (not illustrated) in order to adjust the timings of the clock signal. The clock signal may be a data strobe signal.

To reduce an interference effect that may occur on the I/O lines DQ during the signal training operation, the interface component 111 and the memory device 120 may utilize restricted test data of a predetermined pattern, wherein the test data includes restricted test data. To reduce the interference effect, the restricted test data may toggle less than fully toggling data that unceasingly toggles between '0' and '1'. In an embodiment, the restricted test data may be configured by Gray code. In an embodiment, the restricted test data may be configured by one hot code. In an embodiment, the restricted test data may toggle for a predetermined time on a selected I/O line among the I/O lines DQ.

Therefore, in an embodiment, the restricted test data may be utilized to reduce the interference effect that may occur on the I/O lines DQ, which may improve the accuracy of the signal training operation.

The dummy power consumption component 112 may perform, when the restricted test data is utilized during the signal training operation, a dummy power consumption operation of inducing the memory system 100 to consume a similar amount of power to the power consumed in an actual operation utilizing the fully toggling data.

In an embodiment, the dummy power consumption component 112 may transfer dummy data to the memory device 120 through one or more dummy I/O lines (not illustrated) coupled to the memory device 120 to perform the dummy power consumption operation.

In an embodiment, the dummy power consumption component 112 may control an ECC component (not illustrated), which is included in the controller 110, to perform the dummy power consumption operation. The ECC component includes all circuits, systems, software, firmware and devices necessary for their respective operations and functions.

Although the restricted test data during the signal training operation causes less power consumption than actual data during an actual operation due to the smaller number of toggles of the restricted test data then the actual data, the dummy power consumption component 112 may control the memory system 100 to consume additional power having as much as a difference between consumed amounts of power during the actual operation and the signal training operation. As a result, the power dependency, which is substantially the same as that of the actual operation, may be properly reflected on the I/O lines DQ and thus the accuracy of the signal training operation may be improved.

Under the control of the controller 110, the memory device 120 may store data provided from the controller 110 and may read out stored data to the controller 110. During the signal training operation, the memory device 120 may exchange the restricted test data of the predetermined pattern with the interface component 111 through the I/O lines DQ.

The memory device 120 may include a volatile memory device or a nonvolatile memory device. The volatile memory device may include a Dynamic Random Access Memory (DRAM), a Static Random Access Memory (SRAM) and so forth. The nonvolatile memory device may include a flash memory device (e.g., the NAND Flash or the NOR Flash), a Ferroelectrics Random Access Memory (Fe-RAM), a Phase-Change Random Access Memory (PCRAM), a Magnetic Random Access Memory (MRAM), a Resistive Random Access Memory (ReRAM) and so forth.

Although FIG. 1 illustrates the memory system 100 as including a single memory device 120, the number of memory devices included in the memory system 100 will not be limited thereto.

Figure 2:
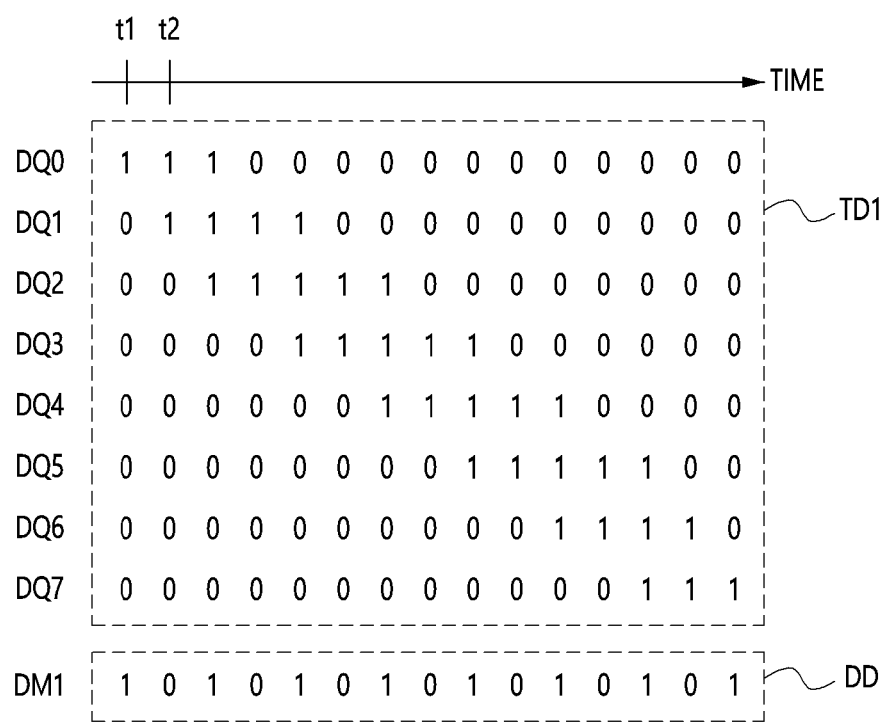
FIGS. 2 to 4 are diagrams illustrating a signal training operation according to an embodiment of the present disclosure.
Figure 3:
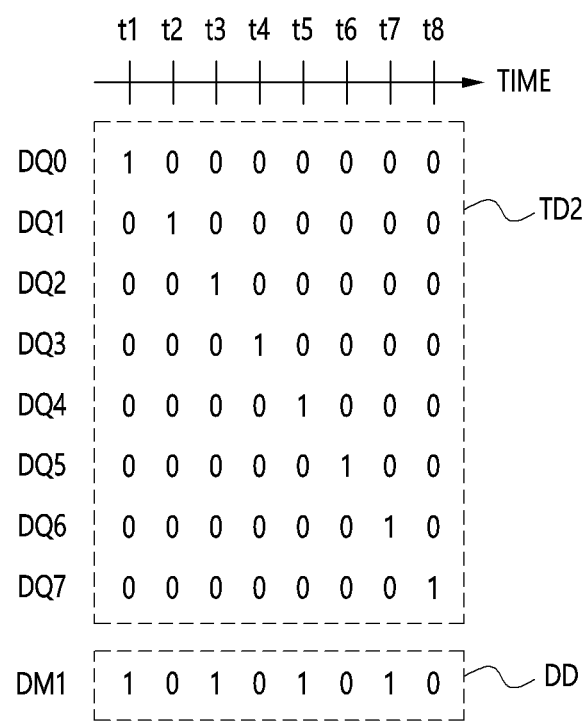
Figure 4:
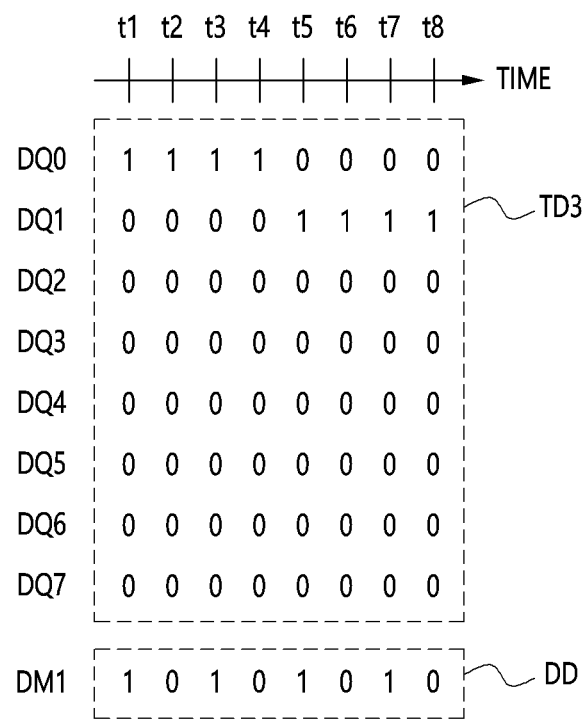

FIGS. 2 to 4 are diagrams illustrating a signal training operation according to an embodiment of the present disclosure. By way of example, FIGS. 2 to 4 illustrate the dummy power consumption operation by the dummy power consumption component 112 that is performed by driving a dummy I/O line DM1.

Referring to FIG. 2, the interface component 111 may exchange restricted test data TD1 with the memory device 120 through I/O lines DQ0 to DQ7 during a signal training operation. The restricted test data TD1 may be configured by Gray code. That is, when comparing patterns of the restricted test data TD1 at a first time point t1 and a second time point t2 for example, only a single signal on the second I/O line DQ1 has changed from a value '0' to a value '1', the restricted test data TD1 may be Gray code.

While the restricted test data TD1 is being transferred through the I/O lines DQ0 to DQ7, the dummy power consumption component 112 may provide the memory device 120 with dummy data DD through the dummy I/O line DM1. As illustrated in FIG. 2, the dummy data DD may be fully toggling data, which will not limit the present invention. Although receiving the dummy data DD, the memory device 120 may ignore the dummy data DD without sampling the dummy data DD, which is different from a case of the restricted test data TD1.

To sum up, although the restricted test data TD1 during the signal training operation causes less power consumption than actual data during an actual operation due to the smaller number of toggles of the restricted test data TD1 than the actual data, additional power as much as the difference between consumed amounts of power during the actual operation and the signal training operation may be consumed on the dummy I/O line DM1. As a result, the power dependency, which is substantially the same as that of the actual operation, may be properly reflected on the I/O lines DQ.

Referring to FIG. 3, restricted test data TD2 may be configured by one-hot code. That is, since only a single signal on one of the I/O lines DQ0 to DQ7 changes to a value '1' at each of the first to eighth time points t1 to t8, the restricted test data TD2 is configured by the one-hot code.

While the restricted test data TD2 is being transferred through the I/O lines DQ0 to DQ7, the dummy power consumption component 112 may provide the memory device 120 with the dummy data DD through the dummy I/O line DM1, which is similar to the embodiment of FIG. 2.

Referring to FIG. 4, the restricted test data TD3 may toggle for a predetermined time period on a selected I/O line among the I/O lines DQ0 to DQ7. For example, only a signal may toggle on the first I/O line DQ0 during the first to fourth time points t1 to t4 and only a signal may toggle on the second I/O line DQ1 during the fifth to eighth time points t5 to t8. Although not illustrated, individual signals may sequentially toggle on the respective third to eighth I/O lines DQ3 to DQ7 after the eighth time point t8.

While the restricted test data TD3 is being transferred through the I/O lines DQ0 to DQ7, the dummy power consumption component 112 may provide the memory device 120 with the dummy data DD through the dummy I/O line DM1, which is similar to the embodiment of FIG. 2.

In an embodiment, the dummy I/O line DM1 may be physically spaced apart from the I/O lines DQ0 to DQ7 in order not to cause the interference effect on the I/O lines DQ0 to DQ7.

FIGS. 2 to 4 illustrate 8 I/O lines DQ0 to DQ7, which will not limit the present disclosure.

Although FIGS. 2 to 4 illustrate the single dummy I/O line DM1, the memory system 100 may include a plurality of dummy I/O lines and the dummy power consumption component 112 may drive the plurality of dummy I/O lines, according to an embodiment.

In an embodiment, the dummy power consumption component 112 may drive dummy I/O lines, a number of which may be determined by Equations 1 to 6 below. The number of the dummy I/O lines may be determined such that a switching power consumption amount $P_{dummy}$ is the difference between a switching power consumption amount $P_{full}$ and a switching power consumption amount $P_{gray}$. The switching power consumption amount $P_{dummy}$ may represent the amount of power consumed while the dummy data DD is transferred through the dummy I/O lines. The switching power consumption amount $P_{full}$ may represent the amount of power consumed during an actual operation. The switching power consumption amount $P_{gray}$ may represent the amount of power consumed while the restricted test data (e.g., restricted test data configured by Gray code) is transferred through the I/O lines DQ. Therefore, Equation 1 below may be established. The switching power consumption amount $P_{full}$ in the actual operation may be a switching power consumption amount while fully toggling data is transferred through the I/O lines DQ.

$$P_{dummy} = P_{full} - P_{gray} \quad \text{[Equation 1]}$$

Equation 2 may represent a switching power consumption amount $P_{switch}$ that is consumed when a signal changes from '0' to '1' or from '1' to '0' on a general signal line. Equations 3 to 5 may be derived on the basis of Equation 2.

$$P_{switch} = \Sigma_i a_i * f * C_{eff} * V_{dd}^2, \quad \text{[Equation 2]}$$

where '$a_i$' represents an operation that signal switches, 'f' represents a frequency, '$C_{eff}$' represents a coefficient factor and '$V_{dd}$' represents an operational voltage.

$$P_{full} = (N_{DQ}) * f_{HS} * C_{eff\text{-}HS} * V_{dd\text{-}HS}^2, \quad \text{[Equation 3]}$$

where '$N_{DQ}$' represents a number of I/O lines DQ and '$\{\ \}_{HS}$' represents a factor of I/O lines DQ.

$$P_{gray} = f_{HS} * C_{eff\text{-}HS} * V_{dd\text{-}HS}^2 \quad \text{[Equation 4]}$$

$$P_{dummy} = (N_{dummy}) * f_{LS} * C_{eff\text{-}LS} * V_{dd\text{-}LS}^2, \quad \text{[Equation 5]}$$

where '$N_{dummy}$' represents a number of dummy I/O lines and '$\{\ \}_{LS}$' represents a factor of dummy I/O lines.

When applying Equations 3 to 5 to Equation 1, Equation 6 may be established to represent a number $N_{dummy}$ of the dummy I/O lines.

$$N_{dummy} = \{(N_{DQ}-1) * f_{HS} * C_{eff\text{-}HS} * V_{dd\text{-}HS}^2\} / (f_{LS} * C_{eff\text{-}LS} * V_{dd\text{-}LS}^2) \quad \text{[Equation 6]}$$

In an embodiment, the frequency $f_{LS}$ of the dummy data may be lower than the frequency $f_{HS}$ of the restricted test data.

Even when the restricted test data is configured by another code other than the Gray code, the number $N_{dummy}$ of the dummy I/O lines may be determined in a similar manner to the above-described scheme. That is, when the switching power consumption amount while the restricted test data is transferred through the I/O lines DQ is derived according to Equation 2 and a result of Equation 2 is applied to Equation 1 instead of the switching power consumption amount $P_{gray}$, the number $N_{dummy}$ of the dummy I/O lines may be determined.

Figure 5:
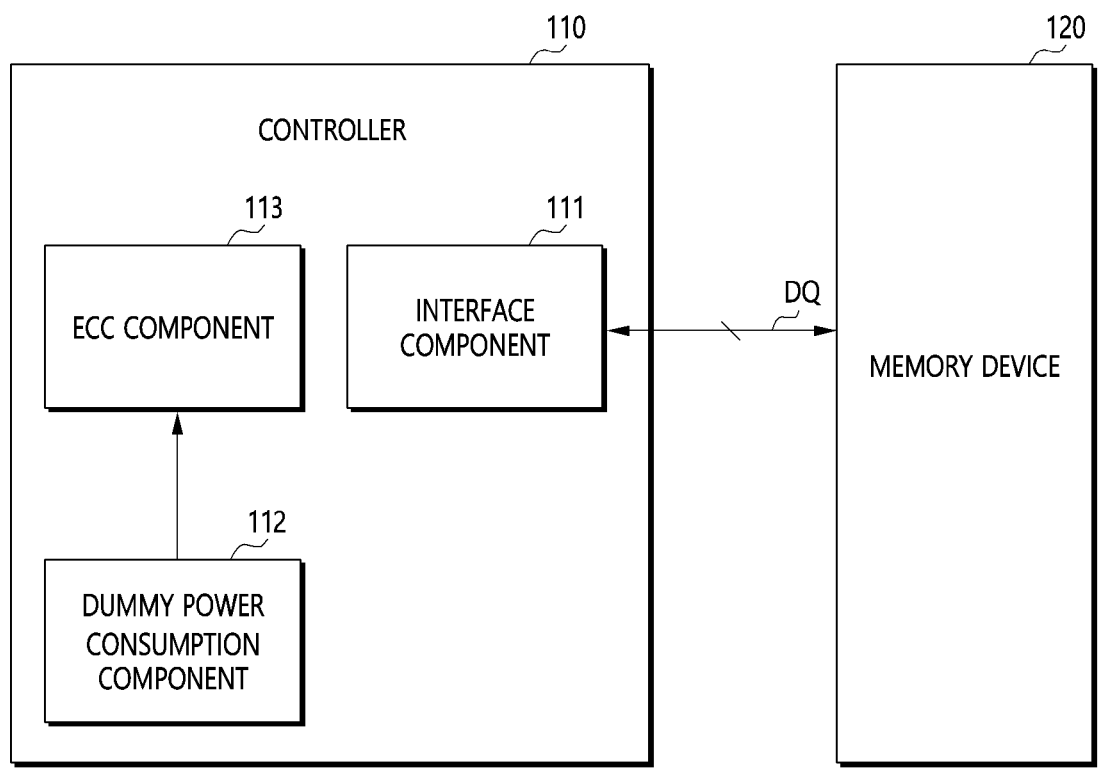
FIG. 5 is a block diagram illustrating a signal training operation according to an embodiment of the present disclosure.

FIG. 5 is a block diagram illustrating a signal training operation according to an embodiment of the present disclosure. FIG. 5 illustrates the dummy power consumption operation of the dummy power consumption component 112, which is performed by controlling an ECC component 113.

Referring to FIG. 5, the controller 110 may further include the ECC component 113. The ECC component 113 may perform an error-correcting operation by encoding data to be stored into the memory device 120 and decoding data read from the memory device 120.

When the restricted test data is transferred through the I/O lines DQ during the signal training operation, the dummy power consumption component 112 may control the ECC component 113 to perform a dummy ECC operation. The dummy ECC operation may include a dummy encoding operation and a dummy decoding operation, rather than an operation of error-correcting data read from the memory device 120.

Specifically, when the restricted test data is transferred from the interface component 111 to the memory device 120, the dummy power consumption component 112 may control the ECC component 113 to perform the dummy encoding operation. During the dummy encoding operation, the ECC component 113 may encode the restricted test data. In an embodiment, the ECC component 113 may encode predetermined random data other than the restricted test data during the dummy encoding operation. The interface component 111 may provide the memory device 120 with at least one of the restricted test data TD1 to TD3 described with reference to FIGS. 2 to 4 regardless of the data encoded by the ECC component 113.

When the restricted test data is transferred from the memory device 120 to the interface component 111, the dummy power consumption component 112 may control the ECC component 113 to perform the dummy decoding operation. During the dummy decoding operation, the ECC component 113 may decode the restricted test data provided from the interface component 111. In an embodiment, the ECC component 113 may decode predetermined random data other than the restricted test data provided from the interface component 111 during the dummy decoding operation.

Therefore, although the restricted test data during the signal training operation causes less power consumption than actual data during an actual operation due to the smaller number of toggles of the restricted test data than the actual data, additional power as much as the difference between consumed amounts of power during the actual operation and the signal training operation may be consumed by the ECC component 113. As a result, the power dependency, which is substantially the same as that of the actual operation, may be properly reflected on the I/O lines DQ.

Figure 6:
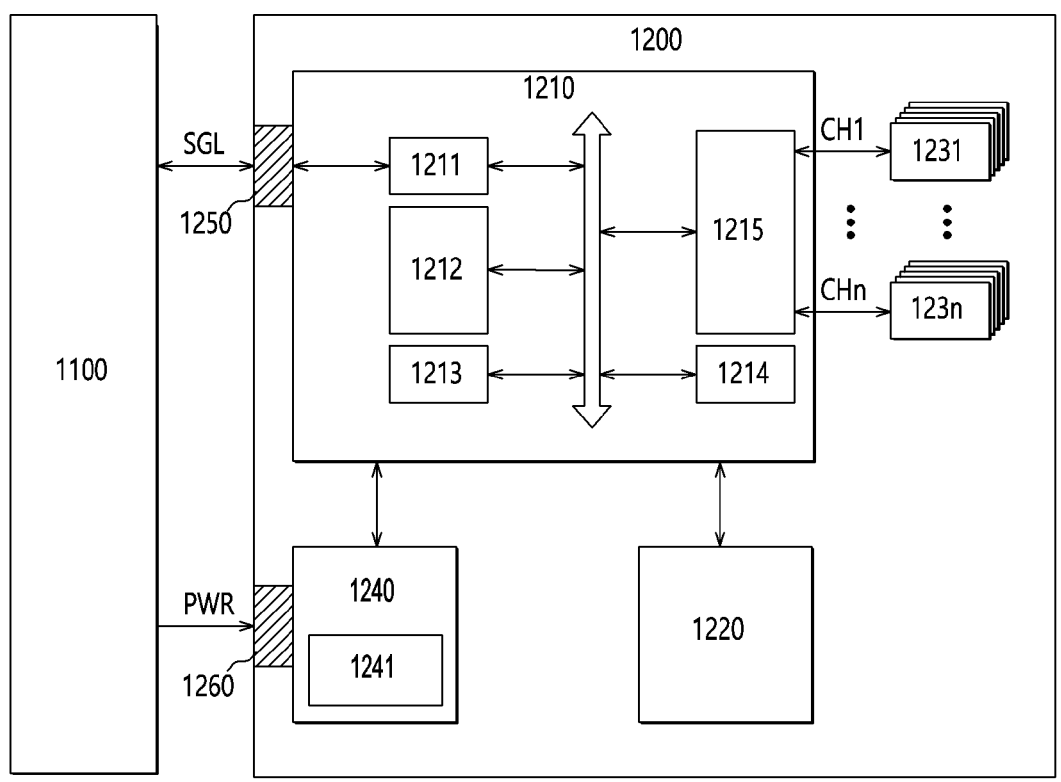
FIG. 6 is a diagram illustrating a data processing system including a solid state drive (SSD) in accordance with an embodiment of the present disclosure.

FIG. 6 is a diagram illustrating a data processing system 1000 including a solid state drive (SSD) 1200 in accordance with an embodiment of the present disclosure. The SSD 1200 may be an embodiment of the memory system 100 shown in FIG. 1. Referring to FIG. 6, the data processing system 1000 may include a host device 1100 and the SSD 1200.

The SSD 1200 may include a controller 1210, a buffer memory device 1220, a plurality of nonvolatile memory devices 1231 to 123n, a power supply 1240, a signal connector 1250, and a power connector 1260.

The controller 1210 may control general operations of the SSD 1200. The controller 1210 may include a host interface component 1211, a control component 1212, a random access memory 1213, an error correction code (ECC) component 1214, and a memory interface component 1215.

The host interface component 1211 may exchange a signal SGL with the host device 1100 through the signal connector 1250. The signal SGL may include a command, an address, data, and so forth. The host interface component 1211 may interface the host device 1100 and the SSD 1200 according to the protocol of the host device 1100. For example, the host interface component 1211 may communicate with the host device 1100 through a communication standard or interface such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnect (PCI), PCI express (PCI-e or PCIe) and universal flash storage (UFS).

The control component 1212 may analyze and process the signal SGL received from the host device 1100. The control component 1212 may control operations of internal function blocks according to a firmware or a software for driving the SSD 1200. The random access memory 1213 may be used as a working memory for driving such a firmware or software. The control component 1212 may include the dummy power consumption component 112 shown in FIG. 1.

The ECC component 1214 may generate the parity data of data to be transmitted to at least one of the nonvolatile memory devices 1231 to 123n. The generated parity data may be stored together with the data in the nonvolatile memory devices 1231 to 123n. The ECC component 1214 may detect an error of the data read from at least one of the nonvolatile memory devices 1231 to 123n, based on the parity data. If a detected error is within a correctable range, the ECC component 1214 may correct the detected error.

The memory interface component 1215 may provide control signals such as commands and addresses to at least one of the nonvolatile memory devices 1231 to 123n, according to control of the control component 1212. Moreover, the memory interface component 1215 may exchange data with at least one of the nonvolatile memory devices 1231 to 123n, according to control of the control component 1212. For example, the memory interface component 1215 may provide the data stored in the buffer memory device 1220, to at least one of the nonvolatile memory devices 1231 to 123n, or provide the data read from at least one of the nonvolatile memory devices 1231 to 123n, to the buffer memory device 1220. The memory interface component 1215 may include the interface component 111 shown in FIG. 1.

The buffer memory device 1220 may temporarily store data to be stored in at least one of the nonvolatile memory devices 1231 to 123n. Further, the buffer memory device 1220 may temporarily store the data read from at least one of the nonvolatile memory devices 1231 to 123n. The data temporarily stored in the buffer memory device 1220 may be transmitted to the host device 1100 or at least one of the nonvolatile memory devices 1231 to 123*n* according to control of the controller 1210.

The nonvolatile memory devices 1231 to 123*n* may be used as storage media of the SSD 1200. The nonvolatile memory devices 1231 to 123*n* may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 7:
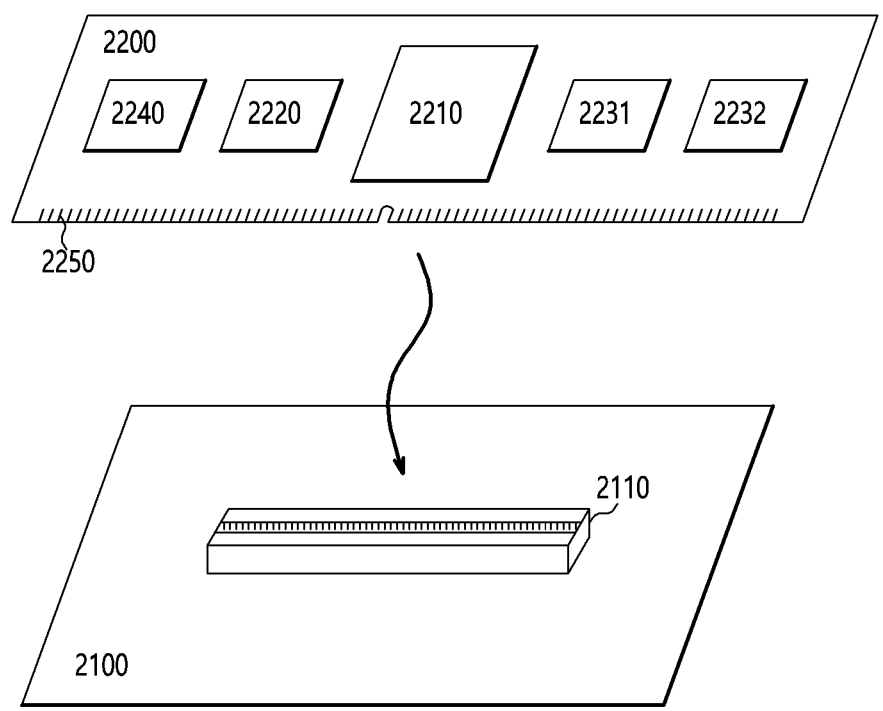
FIG. 7 is a diagram illustrating a data processing system including a memory system in accordance with an embodiment of the present disclosure.

FIG. 7 is a diagram illustrating a data processing system 2000 including a memory system 2200 in accordance with an embodiment of the present disclosure. Referring to FIG. 7, the data processing system 2000 may include a host device 2100 and the memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control general operations of the memory system 2200. The controller 2210 may be configured in the same manner as the controller 1210 shown in FIG. 6.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the memory system 2200.

The PMIC 2240 may provide the power inputted through the connection terminal 2250, to the inside of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth, and power may be transferred between the host device 2100 and the memory system 2200. The connection terminal 2250 may be configured into various types depending on an interface scheme between the host device 2100 and the memory system 2200. The connection terminal 2250 may be disposed on any side of the memory system 2200.

Figure 8:
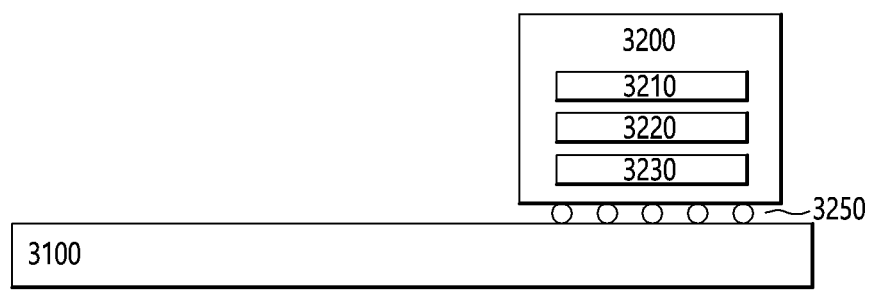
FIG. 8 is a diagram illustrating a data processing system including a memory system in accordance with an embodiment of the present disclosure.

FIG. 8 is a diagram illustrating a data processing system 3000 including a memory system 3200 in accordance with an embodiment of the present disclosure. Referring to FIG. 8, the data processing system 3000 may include a host device 3100 and the memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control general operations of the memory system 3200. The controller 3210 may be configured in the same manner as the controller 1210 shown in FIG. 6.

The buffer memory device 3220 may temporarily store data to be stored in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 9:
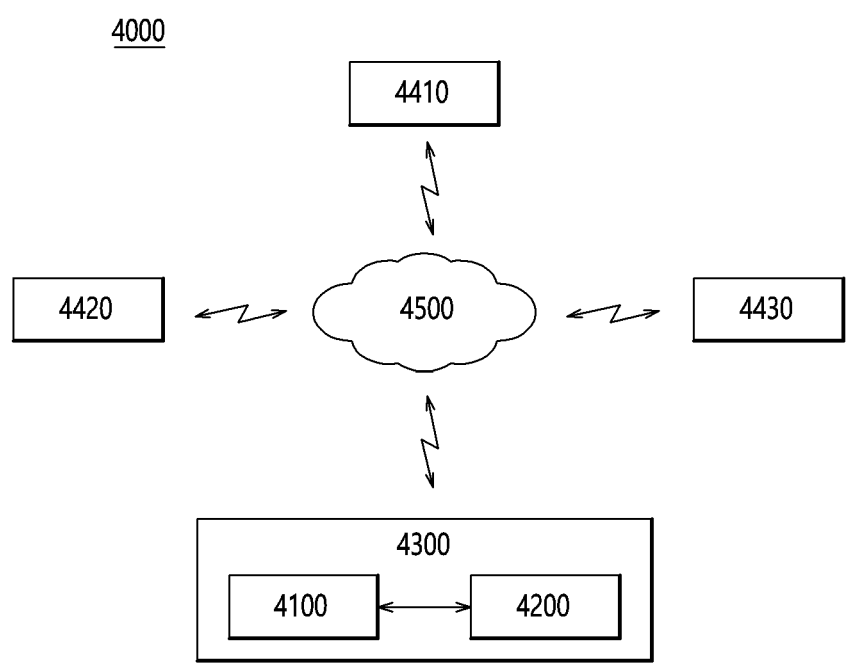
FIG. 9 is a diagram illustrating a network system including a memory system in accordance with an embodiment of the present disclosure.

FIG. 9 is a diagram illustrating a network system 4000 including a memory system 4200 in accordance with an embodiment of the present disclosure. Referring to FIG. 9, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 100 shown in FIG. 1, the SSD 1200 shown in FIG. 6, the memory system 2200 shown in FIG. 7 or the memory system 3200 shown in FIG. 8.

Figure 10:
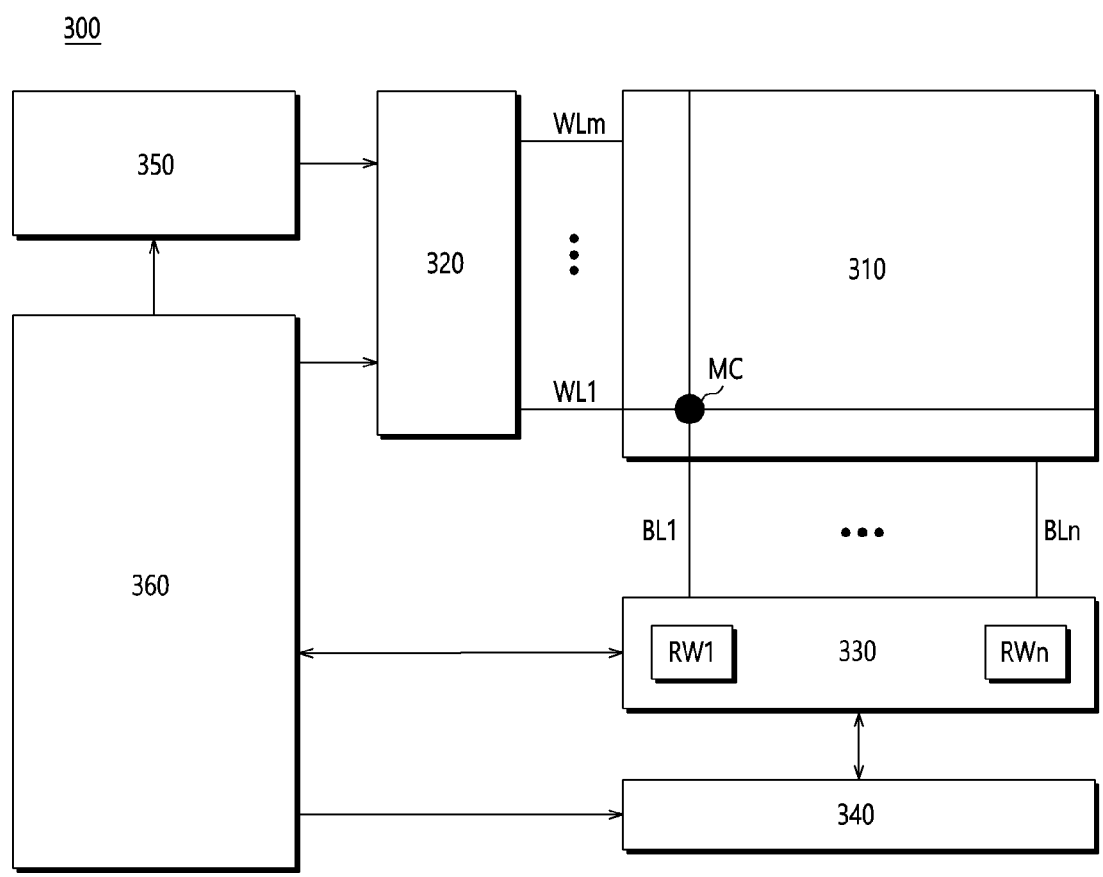
FIG. 10 is a block diagram illustrating a nonvolatile memory device included in a memory system in accordance with an embodiment of the present disclosure.

FIG. 10 is a block diagram illustrating a nonvolatile memory device 300 included in a memory system in accordance with an embodiment of the present disclosure. Referring to FIG. 10, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from an external device (e.g., a memory controller). For example, the control logic 360 may control operations of the nonvolatile memory device 300 such as read, write and erase operations of the nonvolatile memory device 300.

According to an embodiment, a memory system may be capable of performing a signal training operation with improved accuracy.

While certain embodiments have been described above, it will be understood to those skilled in the art that the embodiments described are by way of example only. Accordingly, the memory system should not be limited based on the described embodiments. Rather, the memory system described herein should only be limited in light of the claims that follow when taken in conjunction with the above description and accompanying drawings. Furthermore, the embodiments may be combined to form additional embodiments.

What is claimed is:

1. A memory system comprising:
a memory device; and
a controller coupled to the memory device through input/output (I/O) lines,
wherein the controller includes:
an interface component configured to perform a signal training operation for adjusting a timing of a clock signal, to which test data is synchronized; and
a dummy power consumption component coupled to the memory device through one or more dummy I/O lines and configured to perform a dummy power consumption operation by transferring dummy data to the memory device through the dummy I/O lines while the test data is being transferred from the interface component to the memory device through the I/O lines.

2. The memory system of claim 1,
wherein the dummy power consumption component is configured to transfer the dummy data through the dummy I/O lines, and
wherein the number of the dummy I/O lines is determined such that a switching power consumption amount consumed while the dummy data is transferred through the dummy I/O lines is a difference between a switching power consumption amount consumed during an actual operation and a switching power consumption amount consumed while the test data is transferred through the I/O lines.

3. The memory system of claim 1, wherein the dummy data has a lower frequency than the test data.

4. The memory system of claim 1, wherein the dummy I/O lines are physically spaced apart from the I/O lines in order not to cause an interference effect on the I/O lines.

5. The memory system of claim 1,
wherein the controller further includes an error correction code (ECC) component, and
wherein the dummy power consumption component is configured to perform the dummy power consumption operation by controlling the ECC component to perform a dummy ECC operation.

6. The memory system of claim 5, wherein the ECC component is configured to perform the dummy ECC operation on predetermined random data other than the test data.

7. The memory system of claim 1, wherein the test data includes restricted test data that toggles less than fully toggling data.

8. A memory system comprising:
a memory device coupled to one or more input/output (I/O) lines and one or more dummy I/O lines; and
a controller configured to transfer dummy data to the memory device through the dummy I/O lines while transferring test data to the memory device through the I/O lines during a signal training operation.

9. The memory system of claim 8,
wherein the controller is configured to transfer the dummy data through the dummy I/O lines, and
wherein the number of the dummy I/O lines is determined such that a switching power consumption amount consumed while the dummy data is transferred through the dummy I/O lines is a difference between a switching power consumption amount consumed during an actual operation and a switching power consumption amount consumed while the test data is transferred through the I/O lines.

10. The memory system of claim 8, wherein the dummy data has a lower frequency than the test data.

11. The memory system of claim 8, wherein the dummy I/O lines are physically spaced apart from the I/O lines in order not to cause an interference effect on the I/O lines.

12. The memory system of claim 8, wherein the dummy data is fully toggling data and the test data toggles less than the fully toggling data.

13. The memory system of claim 8, wherein the test data includes restricted test data that toggles less than fully toggling data.

14. The memory system of claim 8, wherein the memory device is configured to receive the dummy data transferred through the dummy I/O lines and to ignore the received dummy data.

15. The memory system of claim 8, wherein the controller is configured to perform the signal training operation for adjusting a timing of a clock signal, to which the test data is synchronized.

16. A memory system comprising:
a memory device; and
a controller coupled to the memory device through input/output (I/O) lines and including an error correction code (ECC) component configured to perform an error-correcting operation on data transferred from the memory device through the I/O lines,
wherein the ECC component is configured to perform a dummy ECC operation while restricted test data is transferred from the controller to the memory device through the I/O lines during a signal training operation.

17. The memory system of claim 16, wherein the ECC component is configured to perform the dummy ECC operation on the test data or predetermined random data other than the test data.

18. The memory system of claim 16, wherein the restricted test data toggles less than fully toggling data.

* * * * *